United States Patent [19]

Takanashi et al.

[11] 4,366,470
[45] Dec. 28, 1982

[54] CONVERTER

[75] Inventors: Akira Takanashi; Yasuhiko Ishigami, both of Mitaka, Japan

[73] Assignees: Hitachi, Ltd.; Hitachi Microcomputer Engineering Ltd., both of Tokyo, Japan

[21] Appl. No.: 232,191

[22] Filed: Feb. 6, 1981

[30] Foreign Application Priority Data

Feb. 20, 1980 [JP] Japan .................................. 55/19011

[51] Int. Cl.³ ............................................ H03K 13/02
[52] U.S. Cl. ......................... 340/347 DA; 179/1 SA; 364/607; 328/14; 84/1.26; 340/347 AD
[58] Field of Search ... 340/347 DA, 347 M, 347 AD, 340/347 DD, 147 T, 384 R, 384 E; 179/1 SA, 1 SG, 1 SM; 328/14; 364/607; 307/251, 279; 84/1.13, 1.26, 1.09

[56] References Cited

U.S. PATENT DOCUMENTS

| 3,945,000 | 3/1976 | Suzuki | 340/347 DD |
| 3,984,830 | 10/1976 | Buchanan | 340/347 DA |
| 4,173,916 | 11/1979 | Inoue | 84/1.26 |
| 4,236,437 | 12/1980 | Howell | 84/1.26 |

OTHER PUBLICATIONS

Hamade "IEEE Journal of Solid-State Circuits", vol. SC-B, No. 6, Dec. 1978, pp. 785-791.

Primary Examiner—Charles D. Miller
Attorney, Agent, or Firm—Craig and Antonelli

[57] ABSTRACT

A converter includes a voltage selector which employs IGFETs as voltage switching elements, and a controller which controls the IGFETs. Each of the IGFETs in the voltage selector is made either the P-channel type or the N-channel type, depending upon a voltage level to be thereby switched and a level of a binary signal supplied from the controller. As a result, a voltage of comparatively great level can be switched by a binary signal of small level amplitude.

15 Claims, 14 Drawing Figures

CONVERTER

BACKGROUND OF THE INVENTION

This invention relates to a converter which is constructed of a plurality of insulated-gate field effect transistors (hereinbelow, abbreviated to "FETs") put into a semiconductor integrated circuit device, and more particularly to a converter which is used as a digital-to-analog converter (hereinafter, abbreviated to "DAC") or an analog-to-digital converter (hereinafter, abbreviated to "ADC").

A converter which employs FETs as voltage switching elements has been known from, for example, the official gazette of Japanese laid-open patent publication No. 52-28851.

In this known converter, a plurality of P-channel type FETs (hereinbelow, termed "P-type FETs") formed on a single semiconductor substrate are connected in the shape of a tree between a plurality of input points and one output point and are controlled "on" and "off" by a digital signal having a plurality of bits.

By the switching control of the plurality of P-type FETs, one of the plurality of input points as corresponds to the state of the digital signal is coupled to the output point. The respective input points are supplied with voltages of levels different from one another from a resistance voltage divider which divides a reference voltage. Therefore, a voltage of a level corresponding to the state of the digital signal is provided at the output point.

According to the above converter, however, the level of the voltage to be delivered to the output point is limited as will be explained below.

An FET must have its gate potential raised greater than its threshold voltage (hereinafter, termed "$V_{th}$") with respect to its source potential in order to bring it into the "on" state. Accordingly, in case of using the P-type FET as described above, the upper limit of the selectible voltages is restricted by the $V_{th}$ as well as the level of the digital signal to be impressed on the gate of the P-type FET.

The respective P-type FETs formed on the single semiconductor substrate as described above have a bias voltage (hereinbelow, termed "back gate bias voltage") applied from the semiconductor substrate which serves as a common substrate gate. As a result, the $V_{th}$ of each P-type FET has its level increased by the known substrate effect.

In such case where the semiconductor substrate is maintained at the ground potential of the circuit, the back gate bias voltage is formed of the potentials of the source, drain and channel of the P-type FET. Therefore, the P-type FET for switching a voltage of a level great in the absolute value receives a back gate bias voltage of a great level corresponding thereto and accordingly has its $V_{th}$ made great. Usually, an FET of great $V_{th}$ comes to exhibit a comparatively great drain—source resistance under a constant gate bias voltage.

Thus, according to the converter as described above, the voltage which can be delivered to the output point has its level limited, not only by the $V_{th}$ of the FET and the digital signal level as stated previously, but also by the attenuation induced by the increased drain-source resistance of the FET. In other words, it is difficult with such converter to deliver a voltage of a desirable level corresponding to the digital signal.

In order to eliminate the limitations to the output voltage level as described above, the digital signal level for controlling the plurality of P-type FETs "on" and "off" can be increased by employing, for example, a voltage booster circuit. In this case, however, circuit elements for constructing the voltage booster circuit are required.

SUMMARY OF THE INVENTION

It is accordingly an object of this invention to provide a converter which can deliver a great voltage signal even when the level of a digital signal is comparatively low.

Another object of this invention is to provide a converter which can convert a voltage signal of comparatively great level into a digital signal.

Still another object of this invention is to provide the converter suitable for an integrated circuit.

Further objects of this invention will be understood from the following description taken in conjunction with the drawings.

BRIEF DESCRIPTION OF THE DRAWINGS

FIG. 7A is a characteristic curve diagram of a circuit 60 in FIG. 6, while FIG. 7B is an equivalent circuit diagram of the circuit 60.

DESCRIPTION OF THE PREFERRED EMBODIMENTS

Hereunder, this invention will be described in detail in connection with embodiments.

Figure 1:
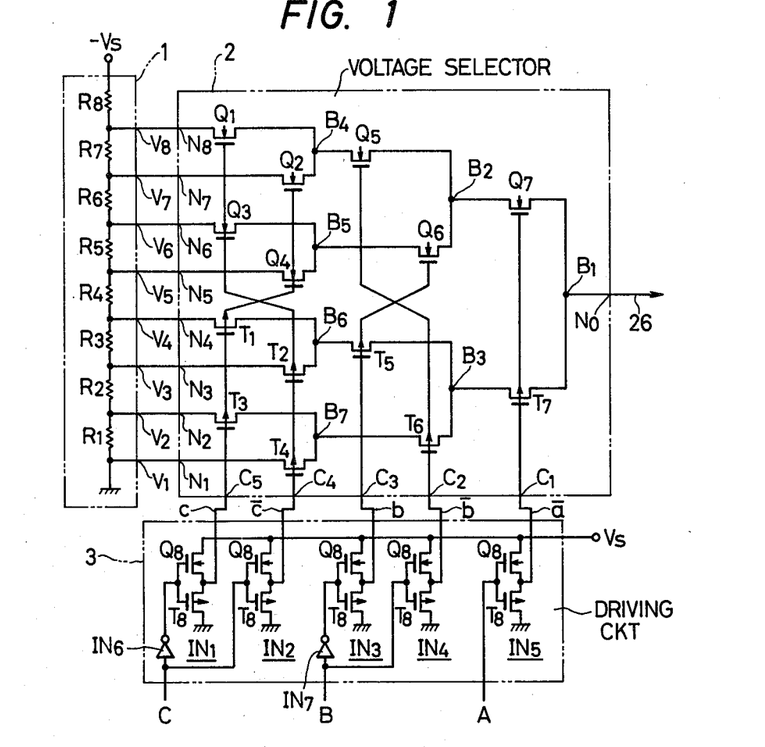
FIG. 1 is a circuit diagram of a converter embodying this invention.

FIG. 1 shows a DAC circuit of an embodiment of this invention for converting a binary signal of 3 bits into an analog voltage.

Referring to the figure, numeral 1 designates a reference voltage circuit which receives a reference voltage (hereinbelow, denoted by "$-V_s$") supplied to a terminal $-V_s$, thereby to deliver voltages of levels different from one another to its output points $V_1$ to $V_8$. As shown in the figure, this reference voltage circuit 1 is constructed of a voltage divider which is substantially composed of resistors $R_1$ to $R_8$ connected in series.

Although not specifically restricted, the respective resistors $R_1$ to $R_8$ are made resistance values equal to one another. The reference voltage $-V_s$ is made a value of, for example, $-3$ volts. Accordingly, a voltage drop of $-\frac{3}{8}$ volt develops across each of the resistors $R_1$ to $R_8$, and the voltages (hereinafter, written "$V_1$", "$V_2$" etc.) to be delivered to the output points $V_1$ to $V_8$ are correspondingly determined. By way of example, the voltage $V_5$ becomes $-3/2$ volts, i.e., $-1.5$ volts.

Numeral 2 designates a voltage selector which has input points $N_1$ to $N_8$ respectively coupled to the output points $V_1$ to $V_8$ of the reference voltage circuit 1, a common output point $N_0$, and control input points $C_1$ to $C_5$.

The control input point $C_1$ is supplied with a binary signal $\bar{a}$ from a driving circuit 3 to be explained below. The control input point $C_2$ is supplied with a binary signal $\bar{b}$, and the control input point $C_3$ is supplied with a binary signal b complementary to the binary signal $\bar{b}$. Likewise, the control input points $C_4$ and $C_5$ are respectively supplied with binary signals $\bar{c}$ and c.

As shown in the figure, the voltage selector 2 includes P-type FETs $T_1$ to $T_7$ and N-type FETs $Q_1$ to $Q_7$ which are connected in the shape of a tree between the input points $N_1$ to $N_8$ and the common output point $N_0$.

The respective FETs to be coupled to branches $B_1$ to $B_7$ in the tree have their channel conductivity types determined so as to be turned "on" by binary signal levels which afford difference voltages greater in the absolute value than voltages $V_N$ to be thereby switched. The ground potential level of the binary signals which are delivered from the driving circuit 3 is denoted by $V_o$, and the supply voltage level by $V_s$.

In this embodiment, the level of the binary signal which is delivered from the driving circuit 3 is made either the reference voltage $-V_s$ having a negative potential (logic value "1") or the ground (GND) potential (logic value "0") as will be apparent from later description.

In contrast, the voltage $V_5$ among the voltages which are delivered from the reference voltage circuit 1 is made a value equal to half of $-V_s$, the voltages $V_6$, $V_7$ and $V_8$ are respectively made potentials negative with respect to the voltage $V_5$, and the voltages $V_4$, $V_3$, $V_2$ and $V_1$ are respectively made potentials positive with respect to the voltage $V_5$ as stated before.

Accordingly, the level difference between each of the output voltages $V_1$ to $V_4$ of the reference voltage circuit 1 and the "1" level (reference voltage $-V_s$) of the binary signal becomes greater in the absolute value than the level difference between each of the output voltages $V_1$ to $V_4$ and the "0" level (GND potential) of the binary signal. Likewise, the level difference between each of the output voltages $V_6$ to $V_8$ of the reference voltage circuit 1 and the "0" level of the binary signal is greater than the level difference between each of the voltages $V_6$ to $V_8$ and the "1" level of the binary signal.

Regarding the voltage $V_5$, the level differences are equal for both the $\int 1$" level (reference voltage $-V_s$) and the "0" level (GND potential) of the binary signal.

Accordingly, the FETs $T_1$ to $T_4$ for coupling the input points $N_1$ to $N_4$ to branches $B_6$ and $B_7$ are made the P-channel type. The FETs $T_5$ and $T_6$ for coupling the branches $B_6$ and $B_7$ to the branch $B_3$ and the FET $T_7$ for coupling the branch $B_3$ to the branch $B_1$ are similarly made the P-channel type.

Likewise, the FETs $Q_1$ to $Q_3$ for coupling the input points $N_6$ to $N_8$ to the branches $B_4$ and $B_5$, the FETs $Q_5$ and $Q_6$ for coupling the branches $B_4$ and $B_5$ to the branch $B_2$ and the FET $Q_7$ for coupling the branch $B_2$ to the branch $B_1$ are made the N-channel type.

In this embodiment, the FET $Q_4$ for coupling the input point $N_5$ to the branch $B_5$ may be made either the N-channel type or the P-channel type because the voltage supplied to the input point $N_5$ has the level of $V_s/2$. Herein, it is made the N-channel type.

In the voltage selector 2, the FETs $Q_7$ and $T_7$ coupled to the branch $B_1$ of the tree have their gates coupled to the input point $C_1$ so as to be complementarily controlled "on" and "off" as illustrated in the figure. The FETs $Q_5$ and $Q_6$ coupled to the branch $B_2$ have their gates respectively coupled to the input points $C_2$ and $C_3$ so as to be complementarily controlled "on" and "off" similarly. Likewise, the FETs coupled to the respective branches $B_3$ to $B_7$ have their gates coupled to the control input points $C_2$ to $C_5$ so as to be complementarily controlled "on" and "off" respectively.

Although not shown, the substrate gates of the respective P-type FETs $T_1$ to $T_7$ are coupled to the ground point of the circuit, and those of the respective N-types FETs $Q_1$ to $Q_7$ are coupled to the terminal $-V_s$.

The driving circuit 3 is disposed in order to provide the binary signals $\bar{a}$, $\bar{b}$, b, $\bar{c}$ and c for driving the voltage selector 2, by receiving 3-bit binary signals A to C. Although not especially restricted, the binary signal A is made the binary signal of the most significant bit among the 3-bit binary signals, and the binary signal C the binary signal of the least significant bit.

As shown in the figure, the driving circuit 3 is constructed of complementary type inverters $IN_1$ to $IN_5$ each of which is composed of a P-type FET $T_8$ and an N-type FET $Q_8$ and is supplied with the voltage $-V_s$ as its supply voltage, and complementary type inverters $IN_6$ and $IN_7$ which are constructed similarly to the inverters $IN_1$ to $IN_5$.

Owing to the circuit arrangement as shown in the figure, that one of the input points $N_1$ to $N_8$ of the voltage selector 2 which is determined by the combination of the 3-bit binary signals A to C is coupled to the output point $N_0$. In other words, the voltage which is determined by the combination of the 3-bit binary signals A to C is supplied to the output point $N_0$.

More specifically, when the 3-bit binary signals A, B and C applied to the driving circuit 3 are "0", "0" and "0", the driving circuit 3 provides in response thereto the binary signals $\bar{a}$, $\bar{b}$ and $\bar{c}$ respectively being "1" (reference voltage $-V_s$) and the binary signals b and c respectively being "0" (GND potential). In response to these binary signals, the P-type FETs $T_4$, $T_6$ and $T_7$ in the voltage selector 2 become the "on" states. As a result, the voltage $V_1$ of the input point $N_1$ is supplied to the common output point $N_0$ through the FETs $T_4$, $T_6$ and $T_7$. The voltage at the output point $N_0$ is derived through a lead 26.

When the 3-bit binary signals A, B and C are "1", "1" and "1", the driving circuit 3 responds thereto to provide the binary signals $\bar{a}$, $\bar{b}$ and $\bar{c}$ respectively being "0" and the binary signals b and c respectively being "1". In response to these binary signals, the N-type FETs $Q_1$, $Q_5$ and $Q_7$ in the voltage selector 2 become the "on" states. As a result, the voltage $V_8$ of the input point $N_8$ is derived through the common output point $N_0$ and the lead 26.

In the same manner, the output point $N_0$ is supplied with the voltage $V_7$ when the 3-bit binary signals A, B and C are "1", "1" and "0", with the voltage $V_6$ when they are "1", "0" and "1", with the voltage $V_5$ when they are "1", "0" and "0", with the voltage $V_4$ when they are "0", "1" and "1", with the voltage $V_3$ when they are "0", "1" and "0", and with the voltage $V_2$ when they are "0", "0" and "1".

The N-type FETs $Q_1$ to $Q_8$ and the P-type FETs $T_1$ to $T_8$ are respectively formed on the signal semiconductor substrate by the well-known semiconductor integrated circuit technology.

Figure 2:
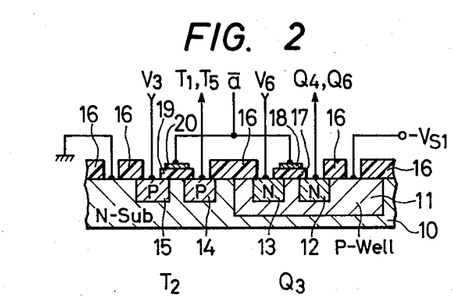
FIG. 2 is a sectional view of a semiconductor substrate on which a P-type FET and an N-type FET are formed.

FIG. 2 shows a sectional view of that portion of the semiconductor substrate in which the N-type FET $Q_3$ and the P-type FET $T_2$ are formed in the shape of a semiconductor integrated circuit.

Referring to the figure, numeral 10 designates the N-type semiconductor substrate to which the ground potential of the circuit is supplied, and numeral 11 a P-type well region which is formed in the surface of the N-type semiconductor substrate 10 and which is supplied with the reference voltage $-V_s$. The P-type FET $T_2$ is constructed of a P-type source region 15 and drain region 14 which are formed in the surface of the semiconductor substrate 10, and a gate electrode 20 which is formed through a gate oxide film 19 on the part of the semiconductor substrate between the source region 15 and the drain region 14. The N-type FET $Q_3$ is constructed of a P-type source region 13 and drain region 12 which are formed in the surface of the P-type well region 11, and a gate electrode 18 which is formed through a gate oxide film 17 on the part of the P-type well region 11 between the source region 13 and the drain region 12.

In FIG. 2, parts having the same functions as in FIG. 1 are assigned the same symbols. Shown at numeral 16 in the figure is a field oxide film which is formed on the surface of the semiconductor substrate 10 and which is relatively thick.

The respective resistors, $R_1$ to $R_8$ constituting the reference voltage circuit 1 are made of, for example, P-type polycrystalline silicon films formed on the thick oxide film 16 overlying the N-type semiconductor substrate 10 though not shown. Even in such case, the output voltages $V_1$ to $V_8$ of the reference voltage circuit 1 can be determined comparatively precisely because deviations in relative characteristics among resistance elements in a semiconductor integrated circuit are, in general, small. In case of using the polycrystalline silicon film as the resistor, its resistivity can be made sufficiently great, so that the occupying area of the resistor in the semiconductor substrate can be made smaller than in case of forming the resistor as a semiconductor resistor which is formed by doping a semiconductor substrate with an impurity opposite in the conductivity type to the substrate. In addition, since the resistors can be made comparatively high resistances, the power dissipation of the circuit can be made low.

In the converter of the embodiment as described above, the voltage to be provided at the output point $N_0$ is not essentially limited by the threshold voltages of the FETs in the voltage selector 2 and the levels of the digital signals applied to the FETs.

By appropriately determining the conductivity types of the FETs in the voltage selector 2 as stated previously, switching control signals of sufficient levels can be given between the gates and sources of the FETs to be put into the "on" states, so that the "on" resistances of the FETs can be sufficiently lowered.

As a result, according to the converter of the embodiment, digital signals of small level amplitudes can be used to provide a voltage responding to the digital signal at high speed and having an accurate level.

The converter of this embodiment does not need any booster circuit or the like as described above. Moreover, the embodiment can be operated with the single potential source which has the level of the reference voltage $-V_s$ relative to the GND potential.

Further, in the voltage selector 2, the P-type FET and N-type FET which receive voltages different from each other from the reference voltage circuit 1, for example, those $T_7$ and $Q_7$ may be controlled by the common binary signal $\bar{a}$ from the driving circuit 3 respectively.

For this reason, the sorts of the binary signals to be delivered from the driving circuit 3 and the number of output control signals corresponding thereto can be reduced.

The converter to which this invention is applied is not restricted to the foregoing embodiment, but various modifications are possible. For example, the input digital signals may well be made a still larger number of bits, and the intervals of the multi-valued voltages to be delivered from the reference voltage circuit may well be varied freely.

The reference voltage circuit and the driving circuit are not restricted to those of the embodiment, but can be modified variously.

Figure 3:
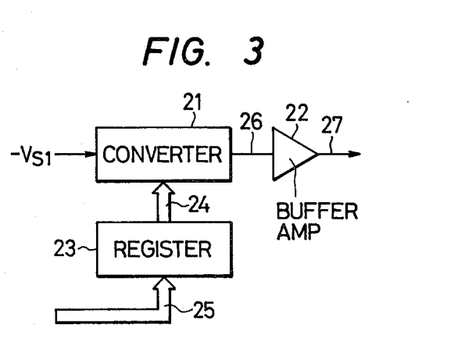
FIG. 3 is a block diagram of a digital-to-analog converter.

FIG. 3 is a block diagram of a digital-to-analog converter.

Referring to the figure, numeral 23 indicates a register which stores binary signals of 3 bits A, B and C applied through a plurality of lines 25 and which transmits them to a converter 21 through a plurality of lines 24.

The converter 21 has the same construction as that of the converter shown in FIG. 1. That is, the converter 21 is constructed of the reference voltage circuit, the voltage selector and the driving circuit, and it supplies a buffer amplifier 22 through a line 26 with a voltage which is determined on the basis of the 3-bit binary signals A, B and C transmitted from the register 23.

The buffer amplifier 22 is endowed with a high input impedance characteristic in order to prevent current from flowing to the common output point $N_o$ of the converter 21. Thus, a voltage of an accurate analog value corresponding to the input digital signals is supplied from the converter 21 to the buffer amplifier 22.

While, in the DAC shown in FIG. 3, the driving circuit is included in the converter 21, it is possible by way of example to directly drive the voltage selector circuit with the outputs of the register 23. In this way, the driving circuit need not be disposed in the converter 21.

Figure 4:
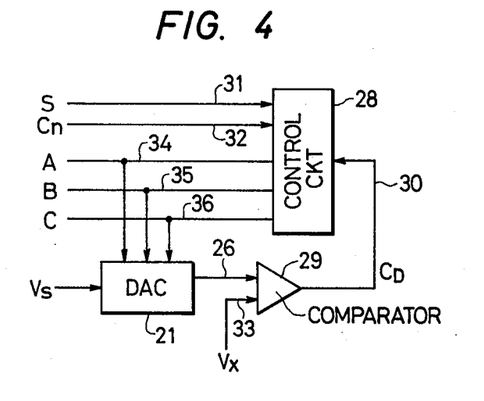
FIG. 4 is a block diagram of an analog-to-digital converter embodying this invention.

FIG. 4 is a block diagram of an embodiment of an analog-to-digital converter (ADC).

This ADC converts an input analog voltage $V_X$ into binary signals of 3 bits A, B and C.

Referring to the figure, numeral 21 indicates a digital-to-analog converter (DAC) which is constructed similarly to the converter shown in FIG. 1.

On the basis of the 3-bit binary signals A, B and C sent through respective lines 34, 35 and 36 from a control circuit 28 to be described later, the DAC 21 provides a line 26 with an analog voltage corresponding to the 3-bit binary signals A, B and C.

A comparator 29 has an input point which receives the voltage delivered from the DAC 21, and another input point which receives an input analog voltage $V_x$ to be converted into a digital signal through a line 33. It compares the voltage from the DAC 21 and the input voltage $V_x$, and transmits a binary signal $C_D$ based on the result of the comparison to the control circuit 28 through a line 30.

Figure 5:
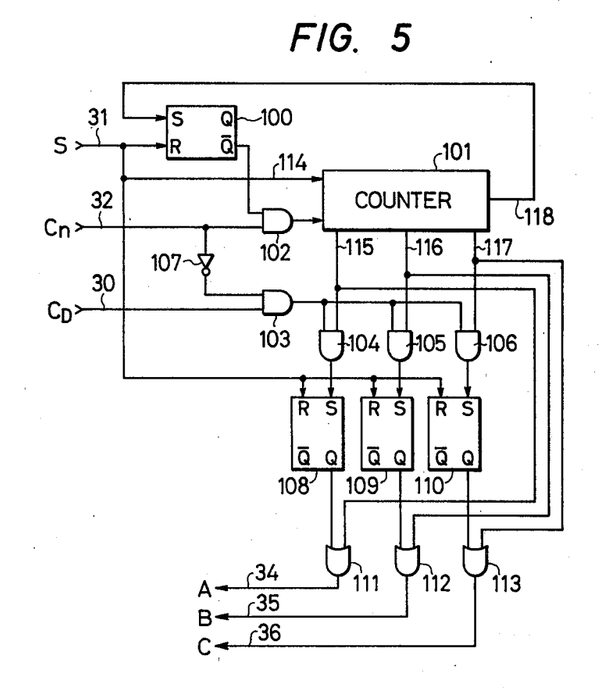
FIG. 5 is a block diagram showing concrete logic blocks of a block 28 in FIG. 4.

The control circuit 28 is constructed as shown in FIG. 5.

In the figure, numerals 100, 108, 109 and 110 designate latch circuits respectively, and numeral 101 designates a counter. A start signal S is applied through a line 31 to the reset terminal (hereinbelow, termed "R terminal") of each of these circuits 100, 108, 109, 110 and 101.

Numeral 102 indicates an AND gate. This AND gate 102 receives the output $\overline{Q}$ of the latch circuit 100 at one input terminal thereof and receives a clock pulse $C_n$ at the other input terminal through a line 32, thereby providing a clock pulse to be supplied to the counter 101.

The counter 101 counts the clock pulses supplied from the AND gate 102, thereby providing its output lines 115 to 118 with binary signals having weights of "1", "2", "3" and "4" respectively. Each of the binary signals supplied to the lines 115, 116 and 117 is supplied to one input terminal of a corresponding one of AND gates 104, 105 and 106 and one input terminal of a corresponding one of OR gates 111, 112 and 113 owing to a circuit connection as shown in the figure.

The binary signal $C_D$ delivered from the comparator 29 shown in FIG. 4 is applied to one input terminal of an AND gate 103 through a line 30. The clock pulse $C_n$ is impressed on the other input terminal of the AND gate 103 through an inverter 107. The output of the AND gate 103 is applied to the other input terminal of each of the AND gates 104, 105 and 106.

The outputs of the respective AND gates 104, 105 and 106 are applied to the set terminals (hereinbelow, called "S terminals") of the latch circuits 108, 109 and 110. The output Q of each of these latch circuits 108, 109 and 110 is applied to the other input terminal of a corresponding one of the OR gates 111, 112 and 113.

Signals supplied from the OR gates 111, 112 and 113 to lines 34, 35 and 36 respectively are used as the binary signals A, B and C to be supplied to the DAC 21 in FIG. 4.

When the fourth clock pulse is impressed on the input terminal, the counter 101 delivers the signal to the set terminal S of the latch circuit 100 through the line 118.

The operation of the ADC shown in FIGS. 4 and 5 will now be described.

First of all, the start signal S which is, for example, the binary signal "1" is impressed on the line 31 from an ADC operation controller not shown. Thus, the latch circuits 100, 108, 109 and 110 and the counter 101 are respectively reset.

When the first clock pulse (binary signal "1") after the resetting of the circuits 100 etc. is applied to the line 32, this clock pulse is supplied to the counter 101 through the AND gate 102.

As a result, the binary signal "1" is delivered from the counter 101 to the line 115. At this time, the lines 116 and 117 are supplied with the binary signals "0". The binary signals delivered from the counter 101 to the lines 115, 116 and 117 are respectively transmitted to the lines 34, 35 and 36 through the OR gates 111, 112 and 113. Accordingly, the line 34 is supplied with the binary signal "1", and the lines 35 and 36 are supplied with the binary signals "0". That is, the 3-bit binary signals A, B and C are respectively made levels "1", "0" and "0".

The DAC 21 receives the 3-bit binary signals "1", "0" and "0" and thus has all its N-type FETs $Q_4$, $Q_6$ and $Q_7$ (refer to FIG. 1) brought into the "on" states, so that it provides the line 26 with the voltage $V_5$ of the level equal to $-V_s/2$.

The voltage $V_5$ provided from the DAC 21 is compared with the input voltage $V_x$ by means of the comparator 29.

In case where the input voltage $V_x$ is higher than the voltage $V_5$, the binary signal $C_D$ of the "0" level is provided from the comparator 29. Conversely, in case where the input voltage $V_x$ is lower than the voltage $V_5$, the binary signal $C_D$ of the level "1" is provided from the comparator 29.

In the case where the binary signal $C_D$ is made the "1" level because of the input voltage $V_x$ being lower than the voltage $V_5$ delivered from the DAC 21 as described above, the AND gate 103 is enabled by this signal. The AND gates 104, 105 and 106 are enabled when the "1" level signal is provided from the AND gate 103 by the "0" level of the clock pulse $C_n$.

Accordingly, the latch circuit 108 is set by the signal of the "1" level supplied from the counter 101 through the line 115. The setting of the latch circuit 108 determines the "1" level of the binary signal A to be delivered to the line 34.

On the other hand, in the case where the binary signal $C_D$ is made the "0" level because of the input voltage $V_x$ being the higher level than the voltage $V_5$, the AND gate 103 is kept disabled by this signal $C_D$. Since the "1" level signal is not provided from the AND gate 103, the AND gates 104 to 106 are kept disabled. Accordingly, any of the latch circuits 108 to 110 is not set.

When the second clock pulse $C_n$ is impressed on the line 32, a data in the counter 101 is thereby updated. As a result, the line 116 is supplied with the "1" level signal, and the lines 115 and 117 with the "0" level signals. If the latch circuit 108 is brought into the set state beforehand as described above, the signals A, B and C to be delivered to the lines 34, 35 and 36 become "1", "1" and "0" levels in response to the signals supplied from the latch circuit 108 and the lines 116 and 117, respectively. Unless the latch circuit 108 is brought into the set state beforehand, the signals A, B and C become "0", "1" and "0" levels, respectively.

In the case where the signals A, B and C become the "1", "1" and "0" levels, the DAC 21 responds thereto to provide the voltage $V_8$ supplied to the terminal $N_8$ in FIG. 1, i.e., the voltage equal to $-(7/8) \times V_s$ volts. This voltage $V_8$ is compared with the input voltage $V_x$ by the comparator 29.

In case where the binary signal $C_D$ of the "0" level is provided from the comparator 29 because the input voltage $V_x$ is higher than the voltage $V_8$, the AND gate 103 is kept disabled similarly to the foregoing. Accordingly, no set input is applied to the latch circuits 108 to 110.

In case where the binary signal $C_D$ of the "1" level is provided from the comparator 29 because the input voltage $V_x$ is lower than the voltage $V_8$, the AND gate 103 is enabled. Accordingly, when the second clock pulse $C_n$ is returned to the "0" level, the "1" level signal is provided from the AND gate 103 to enable the AND gates 104 to 106. The second latch circuit 109 is brought into the set state by the "1" level signal supplied through the AND gate 105. The "1" level output of the latch circuit 109 determines the "1" level of the signal B to be supplied to the line 35.

In the case where the signals A, B and C are made the "0", "1" and "0" levels upon the application of the second clock pulse $C_n$ as described above, the DAC 21 provides the voltage $V_3$, i.e., the voltage of $-(2/8) \times V_s$ volt. Also in this case, similarly to the above, the input voltage $V_x$ and the voltage $V_3$ are compared by the comparator 29, and whether or not the set signal is supplied to the latch circuit 108 is determined. In other words, the level of the signal B is determined.

Likewise, the level of the binary signal C of the lowest bit is determined on the basis of the third clock signal $C_n$.

When, after the 3-bit binary signals A, B and C have been determined as stated above, the fourth clock pulse (level; "1") is supplied to the control circuit 28, a signal of the "1" level is supplied from the counter 101 to the set terminal S of the latch circuit 100 through the line 118. In response to this signal, the latch circuit 100 is set. Further, the set state of the latch circuit 100 enables the AND gate 102. As a result, the clock pulse is inhibited from being impressed on the counter 101.

In case where the DAC embodying this invention is disposed in the ADC in this manner, the booster circuit may be dispensed with as stated previously, so that the ADC can be miniaturized to the extent corresponding to the booster circuit.

Since the amplitudes of the binary signals, in other words, the "1" level and "0" level of the binary signals can be respectively made, for example, the level of the reference voltage $-V_s$ and the level of the ground GND as described above, the control circuit, DAC circuit, comparator etc. are permitted to be operated by the power supply having the level of the reference voltage $-V_s$. That is, the respective circuits can be operated by the use of the single power supply, and an additional power supply such as booster circuit and other power supply is not required.

Further, since the amplitude level of the binary signals can be made small as described above, the rate of change from one level to the other level of the signal can be made great. Therefore, the ADC can be put into a high-speed operation.

Figure 6:
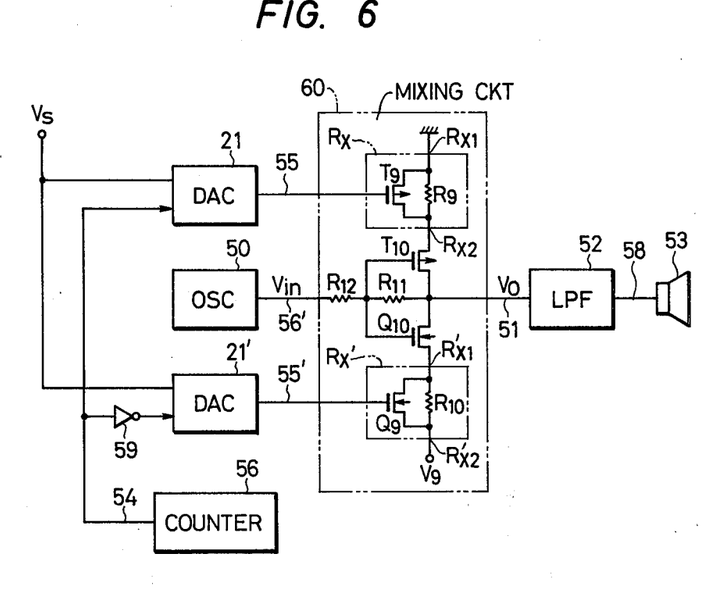
FIG. 6 is a block diagram of an electronic sound generator to which this invention is applied.

FIG. 6 is a block diagram of an embodiment of an electronic sound generator employing a DAC to which this invention is applied.

Referring to the figure, numeral 50 designates an oscillator circuit which produces a low frequency signal of audio-frequency. The output signal of the oscillator 50 is supplied to a mixing circuit 60 through a line 56'.

Numeral 56 indicates a counter which provides a line 54 with three kinds of signals in this embodiment. For the sake of the convenience of the drawing, the single line 54 is illustrated as lines for transmitting the three sorts of signals.

The three sorts of signals consist of a first signal which has, for example, a reference frequency, a second signal which is obtained by dividing the frequency of the first signal into $\frac{1}{2}$, and a third signal which is obtained by dividing the frequency of the first signal into $\frac{1}{4}$.

By way of example, the first signal corresponds to the binary signal C of the lowest bit in each of the foregoing embodiments, the third signal to the binary signal A of the highest bit, and the second signal to the binary signal B of the intermediate bit.

The three sorts of signals delivered to the line 54 are supplied DACs 21 and 21', each having the same construction as that of the DAC shown in FIG. 1, directly and through an inverter 59 respectively.

An output signal from the DAC 21 is an envelope signal, which is supplied to the mixer 60 through a line 55.

Similarly, an output signal from the DAC 21' is an envelope signal, which is supplied to the mixer 60 through a line 55'.

The mixing circuit 60 receives the signal from the oscillator 50 and the envelope signals from the DACs 21 and 21', thereby to provide a signal $V_0$ with these signals mixed. The output signal $V_0$ is supplied to a low-pass filter circuit (hereinbelow, termed "LPF") 52 through a line 51.

The LPF 52 is disposed in order to remove higher harmonic components included in the signal sent from the mixer 60. An output signal from the LPF 52 is supplied to a loudspeaker 53 through a line 58.

The loudspeaker 53 converts into a sound the signal sent from the LPF 52.

As shown in the figure, the mixer 60 is constructed of P-type FETs $T_9$ and $T_{10}$, N-type FETs $Q_9$ and $Q_{10}$ and resistors $R_9$ to $R_{12}$.

In the mixer 60, the P-type FET $T_{10}$ and the N-type FET $Q_{10}$ whose drains are connected in common and whose gates are also connected in common constitute a complementary type amplifier circuit.

The resistor $R_{11}$ which is connected between the common drains and common gates of the P-type FET $T_{10}$ and N-type FET $Q_{10}$, and the resistor $R_{12}$ which is connected between the common gates and an output terminal of the oscillator 50 constitute a feedback circuit for the amplifier circuit.

The P-type FET $T_9$ and the resistor $R_9$ which are connected in parallel between the source of the P-type FET $T_{10}$ and the ground point of the circuit constitute a variable resistance circuit $R_x$. More specifically, the resistance between terminals $R_{x1}$ and $R_{x2}$ of the variable resistance circuit $R_x$ is varied in such a manner that the source—drain resistance of the P-type FET $T_9$ is varied by an analog voltage applied to the gate thereof.

Likewise, the N-type FET $Q_9$ and the resistor $R_{10}$ which are connected in parallel between the source of the N-type FET $Q_{10}$ and a power supply terminal $V_9$ constitute a variable resistance circuit $R_x'$.

As stated before, the output signal of the counter 56 is supplied to the DAC 21 directly and to the DAC 21' through the inverter 59. Accordingly, the signal delivered from the DAC 21 to the line 55 and the signal delivered from the DAC'21' to the line 55' are complementarily changed in response to the change of the output signal of the counter 56.

In response to the changes of the delivered signals, the source—drain resistance of the P-type FET $T_9$ in the variable resistance circuit $R_x$ and the source—drain resistance of the N-type FET $Q_9$ in the variable resistance circuit $R_x'$ are changed in an identical direction. That is, the terminal resistance of the variable resistance circuit $R_x$ and that of the variable resistance circuit $R_x'$ are varied in the identical direction in response to the change of the output signal of the counter 56.

Accordingly, the level of the voltage $V_0$ to be provided from the mixing circuit 60 is controlled by the output signal of the counter 56.

This will be better understood from the ensuing explanation.

In order to facilitate the understanding, it is supposed in the following that the N-type FET $Q_{10}$ is held substantially in the "off" state by the output voltage of the oscillator 50.

Figures 7A, 7B:
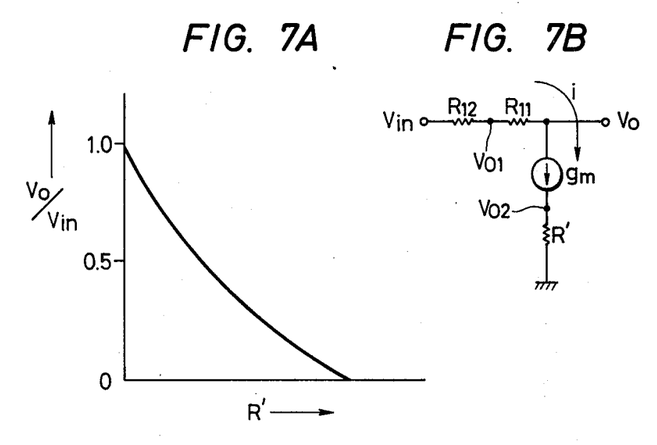

FIG. 7B shows an equivalent circuit which is constructed of the P-type FET $T_{10}$, the resistors $R_{12}$ and $R_{11}$ and the variable resistance circuit $R_x$. In the figure, R′ denotes the terminal resistance of the variable resistance circuit $R_x$, i denotes current which flows through the resistors $R_{12}$, $R_{11}$ etc., and $g_m$ denotes the mutual conductance of the P-type FET $T_{10}$. $V_{in}$ denotes the voltage which is supplied from the oscillator 50. Further, $V_{01}$ denotes a voltage which appears at the juncture between the resistors $R_{12}$ and $R_{11}$, and $V_{02}$ denotes a voltage which appears across the terminals of the variable resistance circuit $R_x$.

The following relations are deduced from the equivalent circuit of FIG. 7B:

$$i = (V_{in} - V_{01})/R_{12} = (V_{01} - V_0)/R_{11} \quad (1)$$
$$= V_{02}/R' = (V_{01} - V_{02}) g_m$$

$$V_{in} - V_{01} = \frac{R_{12}}{R'} V_{02}, \quad V_{01} - V_0 = \frac{R_{11}}{R'} V_{02} \quad (2)$$

Equations (3) to (5) are deduced from the above equations (1) and (2):

$$V_{in} = \left(1 + \frac{R_{12} \cdot R' \cdot g_m}{R'(1 + R' \cdot g_m)}\right) V_{01} \quad (3)$$

$$V_0 = \left(1 - \frac{R_{11} \cdot R' \cdot g_m}{R'(1 + R' \cdot g_m)}\right) V_{01} \quad (4)$$

$$\frac{V_0}{V_{in}} = \frac{1 - \frac{R_{11} \cdot R' \cdot g_m}{R'(1 + R' \cdot g_m)}}{1 + \frac{R_{12} \cdot R' \cdot g_m}{R'(1 + R' \cdot g_m)}} \quad (5)$$

When the mutual conductance $g_m$ of the P-type FET $T_{10}$ is made comparatively great, Equation (5) is simplified into Equation (6) below:

$$\frac{V_0}{V_{in}} = -\frac{R_{11} - R'}{R_{12} + R'} \quad (6)$$

As apparent from Equations (5) and (6), the ratio $V_0/V_{in}$ is varied by the value R′ of the terminal resistance of the variable resistance circuit $R_x$. FIG. 7A shows an example of the ratio ($V_0/V_{in}$)—versus—terminal resistance (R′) characteristic.

Similarly, the ratio $V_0/V_{in}$ at the time when the N-type FET $Q_{10}$ is held substantially in the "on" state and the P-type FET $T_{10}$ is held substantially in the "off" state by the output voltage $V_{in}$ of the oscillator 50 can be evaluated.

As stated before, the terminal resistances of the variable resistance circuits $R_x$ and $R_x'$ can be varied by the combinations of the three sorts of signals delivered from the counter 56. Therefore, the signal $V_0$ whose frequency is coincident with the oscillation frequency of the oscillator 50 and whose level corresponds to the output digital signal of the counter 56 can be provided from the mixer 60.

Figure 8:
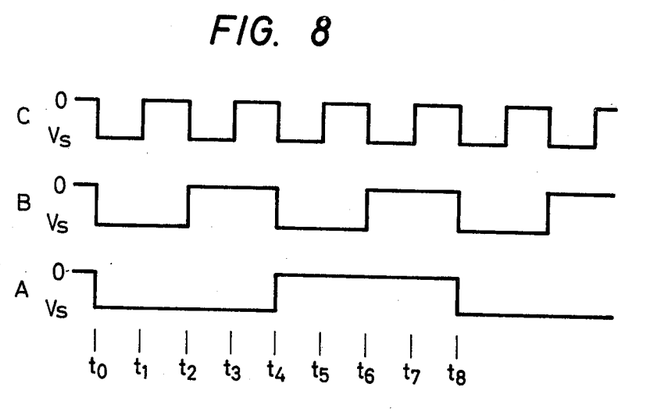
FIGS. 8, 9 and 10A, 10B, 10C, 10D are waveform diagrams showing the waveforms of signal voltages supplied to DACs embodying this invention and output voltages provided therefrom.
Figure 9:
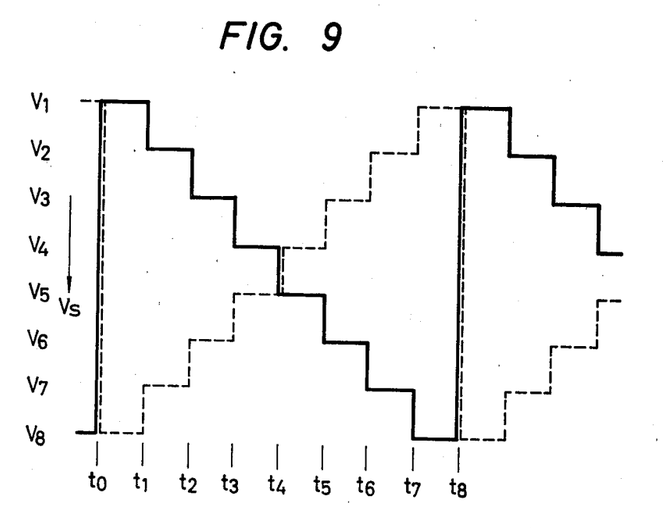

By way of example, when the three sorts of signals A, B and C to be delivered from the counter 56 are sequentially changed as shown in FIG. 8, the DAC 21 responds thereto to provide voltages in a waveform indicated by a broken line in FIG. 9.

On the other hand, the DAC 21′ provides voltages in a waveform indicated by a solid line in FIG. 9.

In FIGS. 8 and 9, symbols $t_0$ to $t_8$ indicate times respectively.

FIGS. 10A to 10D illustrate the respective waveforms of the output of the oscillator 50, the output of the DAC 21′, the output of the DAC 21 and the output of the mixer 60 in the case where the signals as shown in FIG. 8 are provided from the counter 56.

Figure 10A:
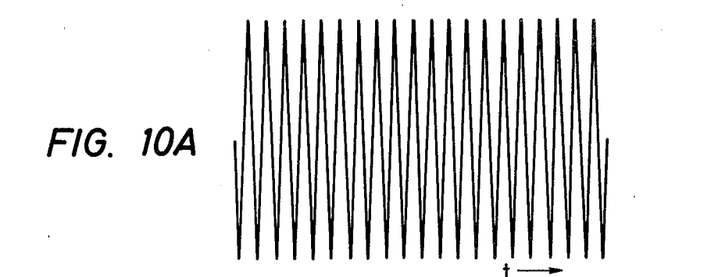
Figure 10B:
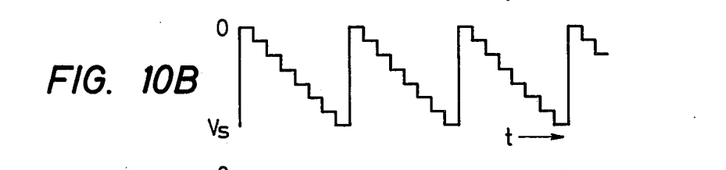
Figure 10C:
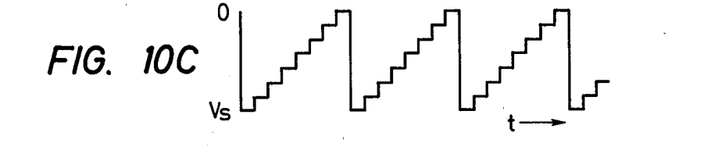
Figure 10D:
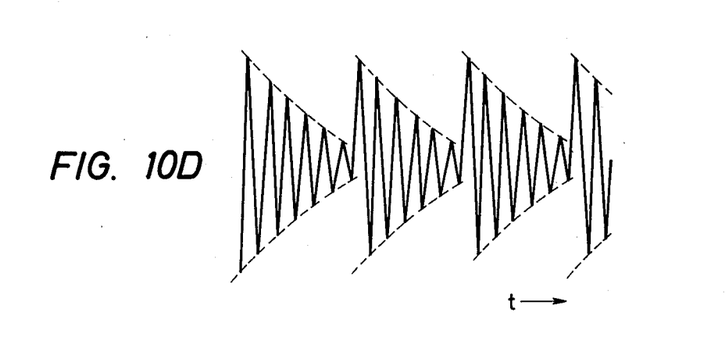

It is added that the voltages provided from the DACs 21 and 21′ are varied roughly rectilinearly versus the time t as shown in FIGS. 10B and 10C, whereas the envelope of the signal being the output of the mixer 60 as shown in FIG. 10D is not varied rectilinearly versus the time t. This is based on the facts that the values of the terminal resistances of the variable resistance circuits $R_x$ and $R_x'$ are not proportional to the variations of the voltages delivered from the DACs 21 and 21′, and that the value of the ratio $V_0/V_{in}$ is not proportional to the variation of the value of the resistance R′ as illustrated in FIG. 7A.

The electronic sound generator of the embodiment above stated can be miniaturized because any booster circuit, etc. need not be used for the DACs employed therein.

While, in the electronic sound generator of the embodiment, the output from the single oscillator is transmitted to the mixer 60, another oscillator may well be further disposed so as to apply an output of this oscillator to the gate of the P-type FET $T_{10}$ within the mixer 60 through a resistor. Thus, the output of the further oscillator and the output of the oscillator 50 are combined. As a result, sounds of various tones can be generated from the mixer 60. Of course, a plurality of such further oscillators may well be disposed.

In the embodiment, the two DACs are used for varying the envelope of the audio signal to be provided from the mixer 60. By putting both the DACs into the same construction, the electronic sound generator has its design facilitated.

However, to the end of miniaturizing the electronic sound generator still more, it is also possible to vary the envelope of the audio signal with a single DAC. In this case, a new envelope signal can be obtained by, for example, inverting with an inverting amplifier an envelope signal delivered from the signal DAC.

In the foregoing embodiment, the signal of the counter 56 is supplied to the DAC 21′ through the inverter 59. However, the inverter 59 as above described can be dispensed with when the counter 56 is so constructed as to be capable of providing also inverted signals of the respective output signals.

I claim:

1. An electronic sound generator comprising:
   first and second converters, each comprising:
      a plurality of input points supplied with voltages of levels different from one another, a single common output point, and a plurality of insulated-gate field effect transistors with their source—drain paths connected between said plurality of input points and said common output point; and
      a driving circuit which provides binary signals of a plurality of bits for controlling "on" and "off" states of said plurality of insulated-gate field effect transistors,
   wherein each of said plurality of insulated-gate field effect transistors has its conductivity type determined to permit switching each said transistor into the "on" state by a level of a binary signal affording a greater level difference relative to the voltage to be switched by said each transistor;

a reference signal generator having an output terminal for providing a plurality of digital reference signals representative of different sounds;

means for coupling said digital reference signals from said output of said reference signal generator directly to the driving circuit of said first converter;

an inverter coupled between the output terminal of said reference signal generator and the driving circuit of said second converter to provide inverted digital reference signals from the reference signal generator to said driving circuit of the second converter;

an oscillator for producing an audio frequency signal at an output terminal;

mixing means coupled to receive the outputs of said first and second converters and said oscillator to produce a single mixed output signal $V_0$ by mixing the respective outputs of said first and second converters and said oscillator; and transducer means coupled to receive the output signal $V_0$ from said mixing means to produce a sound from said output signal $V_0$.

2. A sound generator as defined in claim 1, wherein gates of at least one P-channel type insulated-gate field effect transistor and N-channel type insulated-gate field effect transistor in said voltage selector are connected in common so as to receive an identical binary signal.

3. A sound generator as defined in claim 1, wherein said plurality of insulated-gate field effect transistors in said voltage selector are formed on a single semiconductor substrate.

4. An electronic sound generator comprising:
a first insulated gate field effect transistor of p-channel type having a drain coupled to an output point, a gate, and a source;
a second insulated gate field effect transistor of n-channel type having a drain coupled to the output point, a gate coupled to the gate of the first insulated gate field effect transistor, and a source;
a first variable resistance circuit having a first output terminal connected to a first power supply terminal, a second output terminal connected to a source of the first insulated gate field effect transistor, and a control terminal;
a second variable resistance circuit havving a first output terminal connected to a second power supply terminal, a second output terminal connected to a source of the second insulated gate field effect transistor, and a control terminal;
a first feedback element connected between the output point and the gates of the first and second insulated field effect transistors; and
a second feedback element connected between the gates of the first and second insulated gate field effect transistors and an input point to which an input signal is applied,
wherin a level ratio of an output signal derived from the output point and the input signal is varied by the resistances of the first and second variable resistance circuits.

5. An electronic sound generator as defined in claim 4, wherein an oscillation signal derived from an oscillator is applied to the input point.

6. An electronic sound generator as defined in claim 4, wherein output signals derived from a digital to analog converter are supplied to the control terminals of the first and second variable resistance circuits.

7. An electronic sound generator as defined in claim 6, said digital to analog converter comprising:
a voltage selector which is constructed of a plurality of input points supplied with voltages of levels different from one another, a single common output point, and a plurality of insulated gate field effect transistors with their source-drain paths connected between said plurality of input points and said common output point; and
a driving circuit which provides binary signals of a plurality of bits for controlling "on" and "off" states of said plurality of insulated gate field effect transistors.

8. An electronic sound generator as defined in claim 7, wherein said voltage selector comprises:
a first voltage selector which is constructed of a plurality of first input points supplied with relatively high voltages of levels different from one another, a plurality of insulated gate field effect transistors of p-channel type with their source-drain paths connected between said plurality of first input points and said common output point; and
a second voltage selector which is constructed of a plurality of second input points supplied with relatively low voltages of levels different from one another, a plurality of insulated gate field effect transistors of n-channel type with their source-drain paths connected between said plurality of second input points and said common output points.

9. An electronic sound generator as defined in claim 8, wherein a gate of an insulated gate field effect transistor in the first voltage selector, whose source-drain path is directly connected to the common output point, and a gate of an insulated gate field effect transistor in the second voltage selector, whose source-drain path is directly connected to the common output point, are connected in common so as to receive an identical binary signal.

10. An electronic sound generator as defined in claim 6, wherein said first variable resistance circuit comprises a third insulated gate field effect transistor of p-channel type having a source connected to the first power supply terminal, a drain connected to the source of the first insulated field effect transistor and a gate, and a first resistance element connected between the source and drain of the third insulated gate field effect transistor, and said second variable resistance circuit comprises a fourth insulated field effect transistor of n-channel type having a source connected to the second power supply terminal, a drain connected to the source of the second insulated field effect transistor, and a gate and second resistance element connected between the source and drain of the fourth insulated field effect transistor.

11. An electronic sound generator as defined in claim 10, said digital to analog converter further comprising:
a first digital to analog converter having its output signal supplied to a gate of the third insulated gate field effect transistor; and
a second digital to analog converter having an output signal which is complementarily changed with respect to the output signal of the first digital to analog converter and which is supplied to the gate of the fourth insulated gate field effect transistor.

12. An electronic sound generator as defined in claim 11, further comprising:
a counter having output signals supplied to the first and second digital to analog converter.

13. An electronic sound generator as defined in claim 4, further comprising:
a third feedback element connected between the gates of the first and second insulated gate field effect transistors and a second input point to which an additional input signal is supplied.

14. An electronic sound generator as defined in claim 13, wherein each of said first to third feedback elements comprises a resistance element.

15. An electronic sound generator as defined in claim 4, further comprising:
a loudspeaker having a driving terminal connected to the output point through a low pass filter.

* * * * *